(12) United States Patent
Kanzaki et al.

(10) Patent No.: US 9,665,190 B2
(45) Date of Patent: May 30, 2017

(54) POSITION INDICATOR AND MANUFACTURING METHOD THEREOF

(71) Applicant: Wacom Co., Ltd., Saitama (JP)

(72) Inventors: Hiromichi Kanzaki, Saitama (JP); Gunji Ishihara, Gunma (JP); Taketoshi Ito, Saitama (JP); Takashi Yamaguchi, Saitama (JP); Oki Nagashima, Saitama (JP)

(73) Assignee: Wacom Co., Ltd., Saitama (JP)

( * ) Notice: Subject to any disclaimer, the term of this patent is extended or adjusted under 35 U.S.C. 154(b) by 24 days.

(21) Appl. No.: 14/810,202

(22) Filed: Jul. 27, 2015

(65) Prior Publication Data
US 2016/0034049 A1    Feb. 4, 2016

(30) Foreign Application Priority Data
Aug. 4, 2014 (JP) ................. 2014-158551

(51) Int. Cl.
*G06F 3/038* (2013.01)
*G06F 3/0354* (2013.01)
(Continued)

(52) U.S. Cl.
CPC ............ *G06F 3/038* (2013.01); *B23K 26/08* (2013.01); *B23K 26/351* (2015.10); *B23K 37/04* (2013.01);
(Continued)

(58) Field of Classification Search
CPC .... G06F 3/038; G06F 3/0383; G06F 3/03545; B23K 23/08; B23K 23/351; B23K 2201/42; H05K 2203/171; H05K 2203/175; H05K 2203/173; H05K 2201/0305; H05K 2201/10015; H05K 2201/09871; H05K 1/181; H05K 3/06
See application file for complete search history.

(56) References Cited

U.S. PATENT DOCUMENTS 4,982,892 A    1/1991    Parla et al.
6,198,619 B1   3/2001    Fujioka
(Continued)

FOREIGN PATENT DOCUMENTS

JP    2014-130394 A    7/2014

OTHER PUBLICATIONS

Extended European Search Report dated Jan. 14, 2016, for corresponding EP Application No. 15177648.1-1806, 6 pages.

*Primary Examiner* — Liliana Cerullo
(74) *Attorney, Agent, or Firm* — Seed Intellectual Property Law Group LLP

(57) ABSTRACT

A position indicator includes: a chassis; a substrate disposed inside the chassis; a coil; capacitors disposed on the substrate; interconnects disposed on the substrate such that each at least partially connects a respective one of the capacitors to the coil in parallel; and pairs of land patterns. Each pair of land patterns includes a first land pattern and a second land pattern. Each of the interconnects has a first end connected to a first end of the coil and a second end connected to a second end of the coil, and is connected to one of the capacitors. The pairs of land patterns are disposed such that each of the interconnects is at least partially interposed between the first land pattern and the second land pattern of one of the pairs of land patterns.

19 Claims, 5 Drawing Sheets

(51) Int. Cl.
  *H05K 1/02*    (2006.01)
  *B23K 26/351*  (2014.01)
  *B23K 37/04*   (2006.01)
  *B23K 26/08*   (2014.01)
  *H05K 3/06*    (2006.01)
  *H05K 1/18*    (2006.01)
  *B23K 101/42*  (2006.01)

(52) U.S. Cl.
  CPC ...... *B23K 37/0452* (2013.01); *G06F 3/03545* (2013.01); *H05K 1/0292* (2013.01); *B23K 2201/42* (2013.01); *H05K 1/181* (2013.01); *H05K 3/06* (2013.01); *H05K 2201/0305* (2013.01); *H05K 2201/09781* (2013.01); *H05K 2201/10015* (2013.01); *H05K 2203/107* (2013.01); *H05K 2203/171* (2013.01); *H05K 2203/173* (2013.01); *H05K 2203/175* (2013.01)

(56) References Cited

U.S. PATENT DOCUMENTS

| | | | |
|---|---|---|---|
| 2001/0031507 A1 | 10/2001 | Muff | |
| 2009/0184940 A1* | 7/2009 | Silk | G06F 1/3203 |
| | | | 345/173 |
| 2009/0189628 A1 | 7/2009 | Lee et al. | |
| 2012/0068975 A1 | 3/2012 | Wei et al. | |
| 2014/0184245 A1 | 7/2014 | Hara et al. | |
| 2014/0218883 A1* | 8/2014 | Dakhiya | H01L 23/5384 |
| | | | 361/761 |

\* cited by examiner

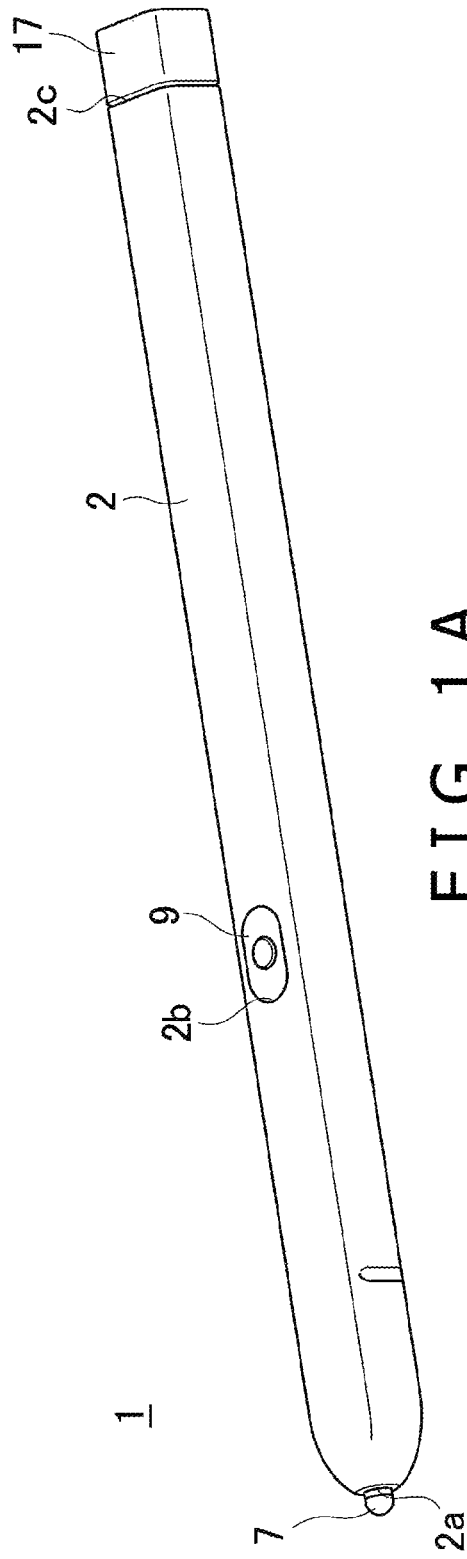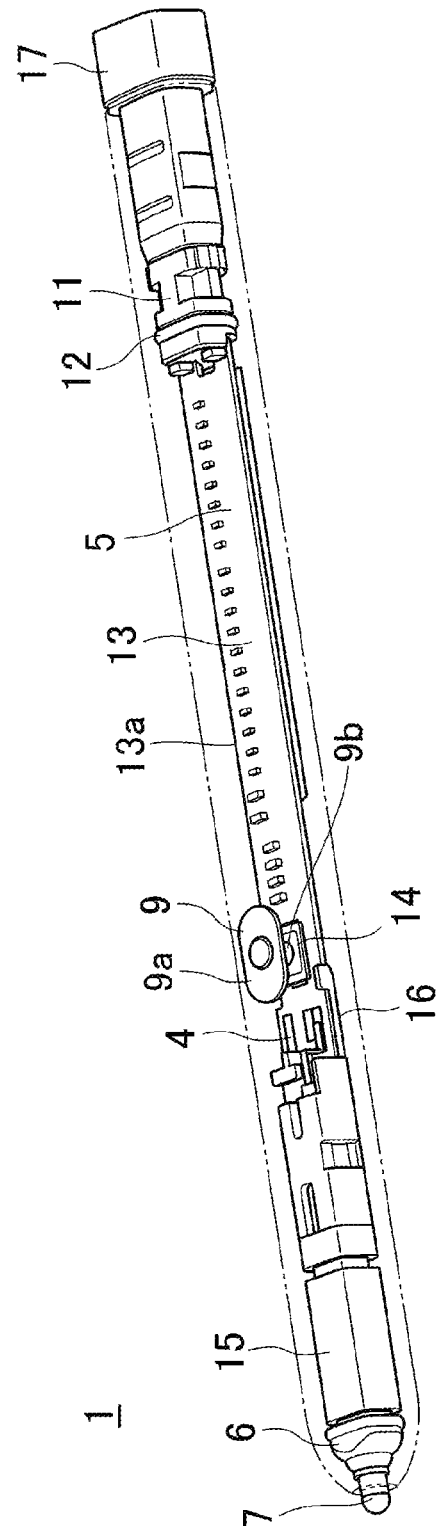
FIG. 1A
FIG. 1B

POSITION INDICATOR AND MANUFACTURING METHOD THEREOF

BACKGROUND OF THE INVENTION

1. Field of the Invention

The present invention relates to a position indicator and a manufacturing method thereof and particularly to a position indicator used in a touch input system and a manufacturing method thereof.

2. Description of the Related Art

Among touch input systems composed of a position detecting device that is a plate-shaped input unit and a position indicator such as an electronic pen are ones that are configured so that the position indicator is capable of transmitting various kinds of information toward the position detecting device and the power necessary for the transmission is supplied from the position detecting device to the position indicator. The position indicator used in this kind of input system is provided with an LC resonant circuit composed of a coil excited by a magnetic field from a sensor coil of the position detecting device and a capacitor connected in parallel to this coil (refer to e.g. Japanese Patent Laid-open No. 2014-130394). When this LC resonant circuit enters the magnetic field, an induced electromotive force is generated in the coil, whereby power is stored in the LC resonant circuit. The position indicator transmits pen information including writing pressure information, side switch information, and so forth by using this power.

In order for the position detecting device to correctly receive the information transmitted by the position indicator, the resonant frequency of the LC resonant circuit needs to be equal to a standard value prescribed in advance. However, errors in manufacturing are caused in the inductance of the coil and the capacitance of the capacitor. Therefore, the occurrence of variation in the resonant frequency is inevitable at the stage immediately after assembling of the LC resonant circuit. Then, the following processing is carried out in a step for manufacturing the position indicator. Specifically, plural capacitors are disposed in parallel to each other in advance. The resonant frequency is measured after the LC resonant circuit is assembled and several capacitors are isolated from the circuit by cutting interconnects according to the measurement result. Thus, the resonant frequency is adjusted to the standard value in an ex-post manner.

However, this cutting of interconnects is performed by manual work thus far and therefore the work cost is high and an improvement is demanded. It will be possible to replace part or all of the plural capacitors by a trimmer capacitor, whose capacitance can be adjusted. However, the trimmer capacitor has other problems that it is impossible to ensure a large adjustment width, that the element itself is expensive, and so forth.

As one of methods to reduce the work cost taken for the interconnect cutting, a method of cutting interconnects not by manual work but by a laser will be possible. Using a laser can automate the interconnect cutting work and thus can reduce the work cost. However, a laser with some degree of intensity needs to be used to surely cut the interconnect and the interconnect cutting by use of such a laser causes a new problem that a large hollow region is generated in a substrate around the interconnect. In particular, in the case of the substrate used in the position indicator, the thickness of the substrate is very thin, about 0.35 mm, and therefore the hollow region penetrates to the back surface of the substrate and even an interconnect on the back surface is cut in some cases. Therefore, it is impossible to perform the interconnect cutting by a laser thus far.

SUMMARY OF THE INVENTION

Therefore, one of the objects of the present disclosure is to provide a position indicator that allows interconnect cutting by a laser and a manufacturing method thereof.

In the case of using the method based on the above-described interconnect cutting, an interconnect that has been cut cannot be returned to the original connected state. That is, it is impossible to incorporate a capacitor that has been isolated from the circuit back into the circuit again. However, in the actual manufacturing step, there is possibly a case in which readjustment of the resonant frequency is necessary after the cutting work is completed. Therefore, a technique that enables a capacitor that has been isolated from the circuit by interconnect cutting to be incorporated into the circuit again is demanded.

Therefore, another of the objects of the present disclosure is to provide a position indicator that allows a capacitor that has been isolated from the circuit by interconnect cutting to be incorporated into the circuit again and a manufacturing method thereof.

A position indicator according to the present disclosure includes a rectangular substrate that has a longer side longer than an inner diameter of a pen-shaped chassis and a shorter side shorter than the inner diameter and is inserted into the inside of the chassis such that the longer side is in parallel to a longitudinal direction of the chassis. The position indicator further includes a coil, a plurality of capacitors juxtaposed on the substrate along the longer side of the substrate, a plurality of interconnects that are each disposed on the substrate corresponding to a respective one of the plurality of capacitors and each connect a corresponding one of the capacitors to the coil in parallel, and a plurality of land patterns that are disposed so that each of the plurality of interconnects is interposed between the land patterns. Each of the plurality of land patterns is formed to have substantially a same thickness as a corresponding one of the interconnects or to have a larger thickness than the corresponding one of the interconnects and is not electrically connected to the corresponding one of the interconnects.

According to the present disclosure, the land patterns play a role to protect the substrate from a laser and thus the hollow regions generated in the substrate when interconnect cutting is performed by using a laser can be alleviated. Therefore, interconnect cutting by a laser can be performed.

In the above position indicator, each of the plurality of interconnects may have a straight line part extending along the longer side of the substrate and the plurality of land patterns may be disposed so that the straight line part of each of the plurality of interconnects is interposed between the land patterns. According to this, the movement direction of the laser at the time of interconnect cutting is unified to the shorter side direction of the substrate. Therefore, the step of interconnect cutting by a laser can be efficiently carried out.

In this position indicator, furthermore, the straight line part of each of the plurality of interconnects may be disposed on one straight line extending along the longer side of the substrate. This makes it possible to carry out the step of interconnect cutting by a laser more efficiently.

In the above respective position indicators, furthermore, the plurality of interconnects may each include a manual jumper position configured to be capable of being cut by removal of a solder. This can avoid the occurrence of manufacturing delay even when a laser irradiation apparatus becomes insufficient due to a sudden increase in production or failure.

Furthermore, in the above position indicator, each of the plurality of interconnects may have first and second nodes, first and third parts each connected to the first node, and a second part connected to the second node. In addition, the plurality of land patterns may be disposed so that the first part of each of the plurality of interconnects is interposed between the land patterns and the second part may be disposed to be interposed between the first and third parts. According to this, the capacitor that has been isolated from the circuit by interconnect cutting can be incorporated into the circuit again by putting the solder between the first part and the second part at the stage before interconnect cutting by a laser is performed and reflowing this solder to move the solder to the region between the second part and the third part after the first part is cut by a laser.

In this position indicator, furthermore, the first part may have a straight line part and the plurality of land patterns may be disposed so that the straight line part of each of the plurality of interconnects is interposed between the land patterns. This can make interconnect cutting by a laser easier compared with the case in which the first part does not have the straight line part.

In the above respective position indicators, furthermore, the plurality of interconnects may include a plurality of first interconnects in each of which the first node is connected to the corresponding one of the capacitors and the second node is connected to the coil and a plurality of second interconnects in each of which the second node is connected to the corresponding one of the capacitors and the first node is connected to the coil, and the plurality of first interconnects and the plurality of second interconnects may be disposed alternately along the longer side of the substrate. This can efficiently dispose the plurality of interconnects in the region in the substrate surface.

Furthermore, in the above respective position indicators, the plurality of interconnects and the plurality of land patterns may be simultaneously formed by etching an electrically-conductive film formed on the substrate. This can set the thickness of each of the plurality of interconnects and the plurality of land patterns to substantially the same value.

Moreover, in the above respective position indicators, the plurality of interconnects and the plurality of land patterns may be formed from the same material. This also makes it possible to set the thickness of each of the plurality of interconnects and the plurality of land patterns to substantially the same value.

In addition, in the above respective position indicators, the shortest distance between each of the plurality of land patterns and the corresponding one of the interconnects may be a constant value. This can prevent the occurrence of variation in the magnitude of the hollow formed by laser irradiation at the exposed part of the substrate inevitably generated between the land pattern and the corresponding interconnect.

A manufacturing method of a position indicator according to the present disclosure includes forming a plurality of interconnects each having one end connected to an interconnect connected to one end of a coil and the other end connected to an interconnect connected to the other end of the coil and a plurality of land patterns that are disposed so that each of the plurality of interconnects is interposed between the land patterns on a surface of a rectangular substrate that has a longer side longer than an inner diameter of a pen-shaped chassis and a shorter side shorter than the inner diameter and is inserted into inside of the chassis in such a manner that the longer side is in parallel to a longitudinal direction of the chassis. The method further includes inserting a capacitor in each of the plurality of interconnects to connect the plurality of capacitors to the coil in parallel.

According to the present disclosure, the land patterns play a role to protect the substrate from a laser and thus the hollow regions generated in the substrate when interconnect cutting is performed by using a laser can be alleviated. Therefore, interconnect cutting by a laser can be performed.

In the above manufacturing method of a position indicator, the forming of the plurality of interconnects and of the plurality of land patterns includes depositing an electrically-conductive film on the surface of the substrate, and forming the plurality of interconnects and the plurality of land patterns by etching the electrically-conductive film. Therefore, the forming the plurality of interconnects and the forming the plurality of land patterns can be favorably performed by the etching process at the same time.

The above manufacturing method of a position indicator may further include cutting the interconnect by moving an irradiation point of a laser from one of a corresponding pair of the land patterns to the other with respect to at least part of the plurality of interconnects. According to this, interconnect cutting by a laser is favorably performed.

In the above manufacturing method of a position indicator, each of the plurality of interconnects may have two pads disposed to be opposed to each other and the inserting of the capacitor in each of the plurality of interconnects may be carried out by connecting one end of the capacitor to one of the two pads and connecting the other end of the capacitor to the other of the two pads. According to this, the capacitor can be favorably inserted in the interconnect.

Furthermore, in the above manufacturing method of a position indicator, the forming the plurality of interconnects may form the plurality of interconnects such that each of the plurality of interconnects has first and second nodes, first and third parts each connected to the first node, and a second part connected to the second node and the second part is interposed between the first and third parts, and the forming of the plurality of land patterns may form the plurality of land patterns such that the first part of each of the plurality of interconnects is interposed between the land patterns. In addition, the method may further include connecting the first part to the second part by a solder, cutting the first part by a laser by moving an irradiation point of the laser from the land pattern disposed on one side of the first part to the land pattern disposed on the other side, and connecting the second part to the third part by the solder by reflowing the solder. According to this, a capacitor that has been isolated from the circuit by cutting of the first part can be incorporated into the circuit again.

In this manufacturing method of a position indicator, the forming of the plurality of interconnects may form the plurality of interconnects such that the plurality of interconnects include a plurality of first interconnects in each of which the first node is connected to a corresponding one of the capacitors and the second node is connected to the coil and a plurality of second interconnects in each of which the second node is connected to a corresponding one of the capacitors and the first node is connected to the coil. This can efficiently dispose the plurality of interconnects in the region in the substrate surface.

According to the present disclosure, the land patterns play a role to protect the substrate from a laser and thus the hollow regions generated in the substrate when interconnect cutting is performed by using a laser can be alleviated. Therefore, interconnect cutting by a laser can be performed.

Furthermore, according to one aspect of the present disclosure, a capacitor that has been isolated from the circuit by interconnect cutting by a laser can be incorporated into the circuit again.

BRIEF DESCRIPTION OF THE DRAWINGS

FIG. 1A is a perspective view showing the appearance of a position indicator according to a first embodiment of the present disclosure, and FIG. 1B is a perspective view that represents a case in a transparent manner and shows the appearance of the position indicator;

DETAILED DESCRIPTION OF THE PREFERRED EMBODIMENTS

Figure 2:
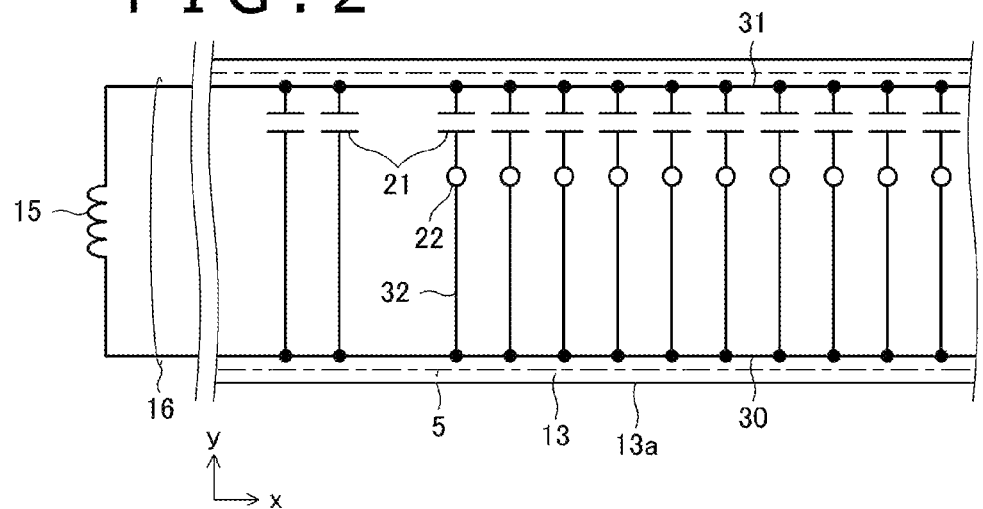
FIG. 2 is a schematic diagram of part of a circuit formed on a substrate shown in FIG. 1B.

Preferred embodiments of the present disclosure will be described in detail below with reference to the accompanying drawings.

A position indicator 1 according to a first embodiment of the present disclosure is a device having a pen shape (electronic pen) as shown in FIG. 1A. The position indicator 1 forms the above-described touch input system with a position detecting device (not shown) that is a plate-shaped input unit.

As shown in FIGS. 1A and 1B, the position indicator 1 has a structure in which various kinds of components such as a writing pressure detector 4, a transmitting/receiving unit 5, an elastic part 6, a pen-tip chip 7, a pressing-down unit 9, a component holder 11, a substrate 13, a switch part 14, a coil 15, a twisted pair cable 16, and a case cap part 17 are disposed inside a pen-shaped case 2 (chassis) and a surface thereof Openings 2a to 2c are made in the case 2 as shown in FIG. 1A. The opening 2a is an opening for allowing the pen-tip chip 7 to pass through it and is made at one end (tip) of the case 2 in the longitudinal direction. When using the position indicator 1, a user makes the pen-tip chip 7 abut against a panel surface (not shown) of the position detecting device. The shape of the part around the tip of the case 2 is formed into a shape tapered toward the tip. This is a shape for making the shape of the position indicator 1 resemble that of ballpoint pens and pencils to thereby give the user of the position indicator 1 a feeling of use equivalent to that of ballpoint pens and pencils.

The pen-tip chip 7 is configured to move toward the other end (tail end) of the case 2 in the longitudinal direction when the user presses the pen-tip chip 7 against the panel surface. The writing pressure detector 4 is configured to be capable of detecting this motion of the pen-tip chip 7 and has a function to detect the magnitude of the force of the pressing by the user, i.e. the writing pressure, on the basis of the result of detection. The detection result is output to the transmitting/receiving unit 5 as writing pressure information. When the user separates the pen-tip chip 7 from the panel surface, the pen-tip chip 7 is returned to the original position by the elastic force of the elastic part 6. Besides, the elastic part 6 also plays a role as a waterproof and dustproof measure that prevents water and dust entering the case 2 from the opening 2a from further penetrating toward the tail end side.

The opening 2b is an opening for allowing the pressing-down unit 9 to pass through it and is made in a side surface of the case 2 in the longitudinal direction. The pressing-down unit 9 includes a planar part 9a and a columnar part 9b protruding from this planar part 9a toward the inside of the case 2. The tip of the columnar part 9b abuts against the switch part 14 placed on the substrate 13. When a user presses the planar part 9a, the pressing force thereof is transmitted to the switch part 14 via the columnar part 9b. Due to this, the switch part 14 is configured to alternately repeat turning-on and turning-off in response to pressing-down of the pressing-down unit 9 by the user. The on/off-state of the switch part 14 is output to the transmitting/receiving unit 5 as side switch information.

Although not shown in the diagram, the opening 2b is composed of a recess to which the planar part 9a is fitted and a through-hole that is formed at the bottom surface of this recess and through which the columnar part 9b is penetrated. The part at which the columnar part 9b is not formed in the lower surface of the planar part 9a (surface on the side of the case 2) is bonded to the part at which the through-hole is not formed in the bottom surface of the recess by e.g. a double-sided tape. The pressing-down unit 9 and the double-sided tape function as a waterproof and dustproof measure that prevents water and dust from entering the case 2 through the opening 2b.

The opening 2c is an opening for inserting the internal components of the position indicator 1 disposed inside the case 2 into the case 2 and is made at the other end (tail end) of the case 2 in the longitudinal direction as shown in FIG. 1A. Into the opening 2c, the component holder 11 for holding the internal components of the position indicator 1 and fixing them to the case 2 is fitted. Furthermore, the entire opening 2c is sealed by the case cap part 17 fitted to the component holder 11. The component holder 11 and the case cap part 17 may be formed as a monolithic component.

In the component holder 11, a groove ranging across the whole circumference in the circumferential direction is made. An O-ring 12 (hermetically-sealing member) is fitted into this groove and the component holder 11 is in tight contact with the inner surface of the case 2 across the whole circumference in its circumferential direction due to this O-ring 12. This causes the O-ring 12 to function as a waterproof and dustproof measure that prevents water and dust entering the case 2 from the opening 2c from further penetrating toward the tail end side. Furthermore, the O-ring 12 also plays a role to fix the component holder 11 to the case 2.

The component holder 11 is joined to the substrate 13 at the end part on the opposite side to the end part fitted to the case cap part 17. Due to this, the substrate 13 and the various kinds of components fixed to the substrate 13 (such as the writing pressure detector 4, the transmitting/receiving unit 5, the elastic part 6, the switch part 14, and the coil 15) are also fixed to the case 2 similarly to the component holder 11.

The substrate 13 is a rectangular member having a longer side 13a longer than the inner diameter of the case 2 and a shorter side (not shown) shorter than the inner diameter of the case 2. After the various kinds of components are attached to the substrate 13, the substrate 13 is inserted into the inside of the case 2 from the opening 2c in the state of being held by the component holder 11, with the longer side 13a parallel to the longitudinal direction of the case 2.

The coil 15 is formed of a wire wound around a core body (not shown) provided between the pen-tip chip 7 and the writing pressure detector 4 with the intermediary of a ferrite core (not shown). The coil 15 is connected to the transmitting/receiving unit 5 disposed on the substrate 13 by the twisted pair cable 16.

The transmitting/receiving unit 5 includes a circuit that carries out transmission and reception of a signal and so forth with the position detecting device existing outside the case 2 and forms the above-described LC resonant circuit with the coil 15. Specifically, the transmitting/receiving unit 5 has a function to receive a magnetic field generated by the position detecting device by the coil 15 and store it in the capacitor as a charge and a function to generate signals to be transmitted to the position detecting device and transmit the signals from the coil 15 by using the charge stored in the capacitor. The transmission and the reception are carried out in a time-division manner.

Regarding signal transmission to the position detecting device, the transmitting/receiving unit 5 is configured to be connected to the writing pressure detector 4 and the switch part 14 by interconnects formed on the substrate 13 and receive the above-described writing pressure information and side switch information from them. The signals generated by the transmitting/receiving unit 5 include a signal indicating the writing pressure information and the side switch information, a continuous signal for position detection used by the position detecting device in order to detect the position of the position indicator 1, and so forth.

Regarding the reception of the magnetic field generated by the position detecting device, the transmitting/receiving unit 5 is configured to have plural capacitors 21 as shown in FIG. 2. These plural capacitors 21 form the above-described LC resonant circuit with the coil 15. Specifically, two interconnects 30 and 31 each extending along an x-direction shown in FIG. 2 (direction parallel to the longer side 13a of the substrate 13) are formed on the substrate 13. These interconnects 30 and 31 are connected to one end and the other end, respectively, of the coil 15 via the twisted pair cable 16. In the region between the interconnects 30 and 31 on the substrate 13, the plural capacitors 21 and plural interconnects 32 are each disposed to be lined up in the x-direction. One interconnect 32 is provided for each capacitor 21 and the capacitor 21 is inserted in the corresponding interconnect 32. Furthermore, the plural interconnects 32 are each connected to the interconnect 30 at one end and connected to the interconnect 31 at the other end. With the above configuration, the plural capacitors 21 and the coil 15 are connected in parallel to each other and an LC resonant circuit is formed by the plural capacitors 21 and the coil 15.

Some of the interconnects 32 are provided with a cutting point 22 that is a part cut by a laser when the resonant frequency of the LC resonant circuit is adjusted as indicated by circles in FIG. 2. When a certain interconnect 32 is cut at the cutting point 22, the capacitor 21 inserted in this interconnect 32 is isolated from the circuit. As a result, the capacitance component of the LC resonant circuit becomes smaller and therefore the resonant frequency of the LC resonant circuit becomes higher. As above, this LC resonant circuit is configured so that the resonant frequency can be adjusted (i.e., increased) by interconnect cutting at the cutting point 22.

The position indicator 1 according to the present embodiment has a characteristic in that a hollow region generated in the substrate 13 can be avoided when cutting of the cutting point 22 is performed by using a laser. This point will be described in detail below with reference to FIG. 3.

Figure 3:
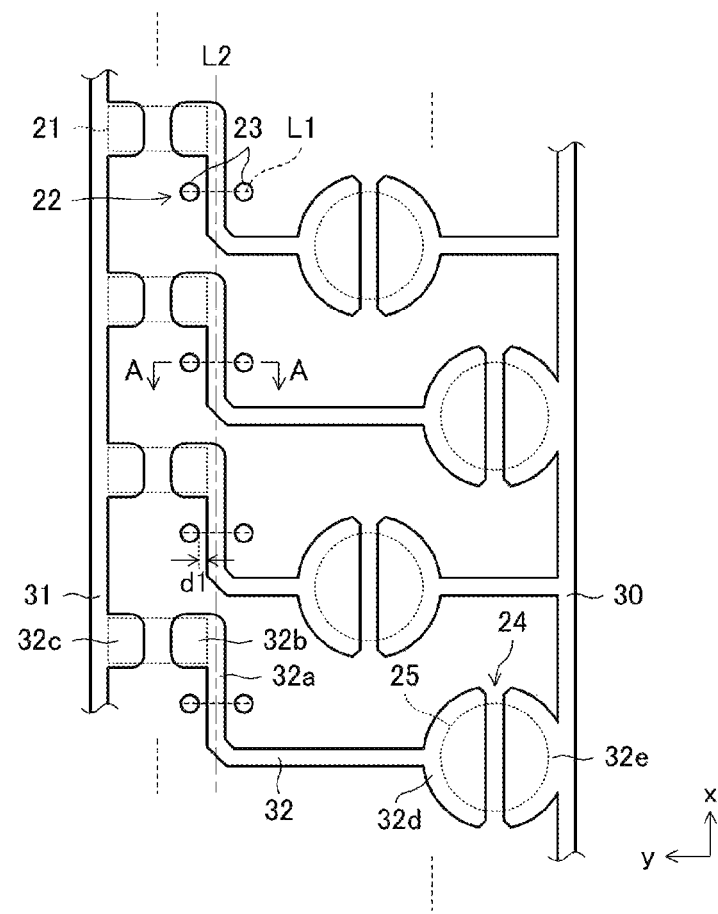
FIG. 3 is a top view of the substrate corresponding to part of the circuit shown in FIG. 2.

FIG. 3 is a diagram made by illustrating part of the configuration of the transmitting/receiving unit 5 shown in the schematic diagram of FIG. 2 in a form closer to the actual configuration. In FIG. 3, only four capacitors 21 (only one of which is labeled) and a configuration corresponding to them are shown.

As shown in FIG. 3, the interconnect 32 includes the following parts: a straight line part 32a extending along the x-direction; a pad 32b formed at one end of the straight line part 32a; a pad 32c connected to the interconnect 31; a pad 32d connected to the other end of the straight line part 32a via a part extending along a y-direction (direction parallel to the shorter side of the substrate 13); and a pad 32e connected to the interconnect 30. The straight line part 32a of each interconnect 32 is disposed on one straight line L2 extending along the x-direction as shown in FIG. 3.

The pads 32b and 32c are each an interconnect pattern that extends in the y-direction and has a substantially rectangular shape, and are formed opposed to each other in the y-direction with the intermediary of a groove having a constant width. The capacitor 21 as a chip component is placed on these pads. One end of this capacitor 21 is connected to the pad 32b and the other end is connected to the pad 32c.

The pads 32d and 32e are each an interconnect pattern having a substantially semicircular shape and are formed opposed to each other in the y-direction across the respective straight line parts with the intermediary of a groove having a constant width. A solder 25 is provided at a position straddling the pads 32d and 32e. The purpose of providing the pads 32d and 32e in the interconnect 32 is to form a manual jumper position 24 at which the interconnect 32 can be cut without using a laser. That is, as shown in FIG. 3, the pads 32d and 32e can be electrically connected to each other as the basic state by attaching the solder 25 to the position straddling the pads 32d and 32e. When the need to cut the interconnect 32 arises, the pads 32d and 32e can be separated from each other by removing the solder 25 and the interconnect 32 can be turned to the cut state (disconnected state).

The manual jumper positions 24 need a comparatively-large area as shown in FIG. 3 and thus are disposed to be alternately displaced in the y-direction. This realizes efficient use of the region on the substrate 13.

The purpose of providing the manual jumper positions 24 is to avoid the occurrence of manufacturing delay in case of a sudden increase in production, failure of a laser irradiation apparatus, and so forth. The interconnect cutting by a laser is advantageous over the interconnect cutting by manual work in reduction in the work cost and so forth. However, because a laser irradiation apparatus, which takes a long time to introduce and repair, is necessary, the configuration that relies only on a laser involves a possibility that insufficiency in the laser irradiation apparatus becomes a bottleneck about manufacturing delay. In contrast, if the manual jumper positions 24 are provided, the interconnect cutting step can be carried on by manual work even when the laser irradiation apparatus becomes insufficient due to a sudden increase in production or failure. Therefore, the occurrence of manufacturing delay can be avoided.

The cutting point 22 is disposed at the straight line part 32a of the interconnect 32. On both sides of the cutting point 22, two land patterns 23 are disposed so that the straight line part 32a is interposed therebetween. These two land patterns 23 are disposed so that the shortest distance d1 between the land pattern 23 and the corresponding straight line part 32a is a constant value.

In the case of cutting the cutting point 22 by a laser, the irradiation point of the laser is moved from the land pattern 23 on one side of the cutting point 22 to the land pattern 23 on the other side. In FIG. 3, the trajectory of the irradiation point of the laser at this time is shown by a line L1. Doing this makes it possible to alleviate a hollow region generated in the substrate 13 due to the laser when the cutting point 22 is cut. This point will be described in more detail below with reference to FIGS. 4A and 4B.

Figure 4A:
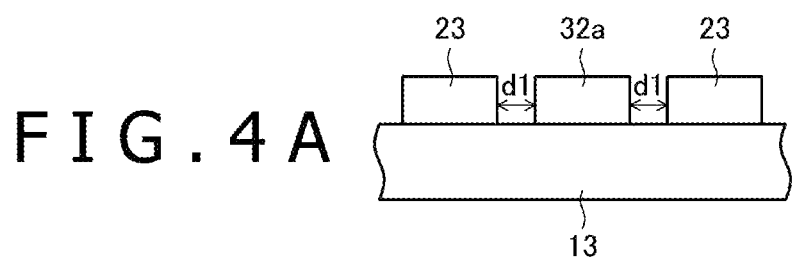
FIG. 4A is a sectional view of the substrate taken along line A-A shown in FIG. 3.
Figure 4B:
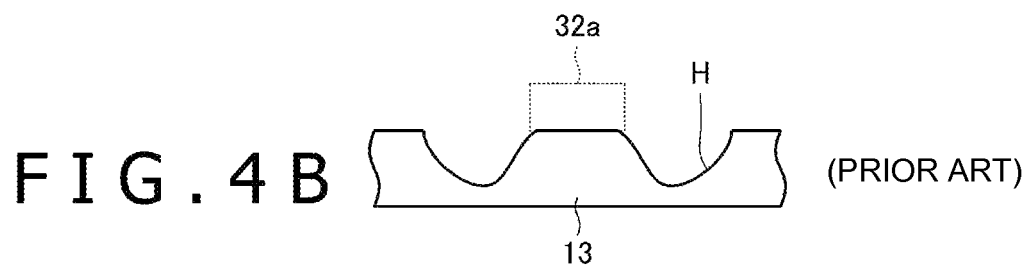
FIG. 4B is a sectional view of a conventional substrate after an interconnect (straight line part) is cut by a laser.

If the land patterns 23 are not used, as shown in a sectional view of FIG. 4B showing the substrate 13 according to the background art, large hollow regions H exist on both sides of the part from which the straight line part 32a is removed after the straight line part 32a is cut by a laser. This is due to that the laser irradiation area cannot help but protrude to both sides of the straight line part 32a to some extent in order to surely cut the straight line part 32a.

In contrast, in the case of the substrate 13 according to the present embodiment shown in FIG. 4A, when the straight line part 32a is cut by a laser, the land patterns 23 on both sides thereof play a role to protect the substrate 13 from the laser. Therefore, the deep hollow regions H like those shown in FIG. 4B are not generated. That is, the hollow regions generated in the substrate 13 by the laser when the cutting point 22 is cut are alleviated.

To achieve the above-described effect, the straight line part 32a needs to be electrically isolated from the two land patterns 23 on both sides of the straight line part 32a. This is because of the following reason. Specifically, if they are electrically connected to each other, the land patterns 23 also need to be surely removed in order to disconnect the interconnect 32 and therefore the laser irradiation needs to be performed from the outside of the land patterns 23. In this case, the hollow regions H are generated outside the land patterns 23.

On the other hand, to minimize damage to the substrate 13 by the laser, it is preferable that the straight line part 32a be as close as possible to the two land patterns 23 on both sides of the straight line part 32a. Therefore, it is preferable for the above-described shortest distance d1 to be designed to as small a value as possible within the range in which the insulation between the straight line part 32a and the land pattern 23 can be ensured. As is understood from the shape of the hollow regions H shown in FIG. 4B, the cutting of the substrate 13 by the laser is suppressed in the regions immediately lateral to the interconnect pattern because the regions are in the shadow of the interconnect pattern. Thus, if the shortest distance d1 is sufficiently small, the hollow formed in the substrate 13 exposed between the straight line part 32a and the land pattern 23 by the laser irradiation can be suppressed to one that is not so deep.

Each land pattern 23 needs to have substantially the same thickness as the corresponding straight line part 32a or be formed to a larger thickness than the corresponding straight line part 32a. This is because, if not so, the land patterns 23 are completely removed and damage is added to the substrate 13 when laser irradiation is performed with the intensity necessary to remove the straight line part 32a.

To realize such a thickness relationship, it is preferable to simultaneously form each interconnect 32 and each land pattern 23 by depositing an electrically-conductive film on the substrate 13 and etching the film. This makes it possible to suppress the difference between the thickness of each interconnect 32 and the thickness of each land pattern 23 within a range equivalent to in-plane variation in the film thickness of the electrically-conductive film (within a range in which they have substantially the same thickness).

Furthermore, each interconnect 32 and each land pattern 23 may be formed by using the same material. This also makes it possible to suppress the difference between the thickness of each interconnect 32 and the thickness of each land pattern 23.

The planar shape of each land pattern 23 may be a circular shape as shown in FIG. 3 or may be a rectangular shape or another shape. It is preferable to decide the specific planar shape and size of each land pattern 23 as appropriate through repetition of experiments under the same condition as the actual process so that the interconnect 32 can be surely cut and damage to the substrate 13 due to the laser can be minimized.

As described above, according to the position indicator 1 in accordance with the present embodiment, the land patterns 23 play a role to protect the substrate 13 from the laser and thus the hollow generated in the substrate 13 when the interconnect 32 is cut by using a laser can be alleviated. Therefore, interconnect cutting by a laser is enabled.

Furthermore, according to the position indicator 1 in accordance with the present embodiment, the cutting point 22 and the manual jumper position 24 are disposed in series in the interconnect 32. Therefore, the occurrence of manufacturing delay can be avoided even when the laser irradiation apparatus becomes insufficient due to a sudden increase in production or failure.

Furthermore, the cutting point 22 of each interconnect 32 is provided at the straight line part 32a extending along the x-direction and the movement direction of the laser at the time of interconnect cutting is unified to the y-direction. Therefore, according to the position indicator 1 in accordance with the present embodiment, the step of interconnect cutting by a laser can be efficiently carried out.

Moreover, the straight line part 32a of each interconnect 32 is disposed on one straight line L2 extending along the x-direction. Thus, the y-coordinate of the start point of the laser at the time of interconnect cutting and the y-coordinate of the end point are unified. Therefore, according to the position indicator 1 in accordance with the present embodiment, the step of interconnect cutting by a laser can be carried out more efficiently.

In addition, according to the position indicator 1 in accordance with the present embodiment, the shortest distance d1 between the straight line part 32a and the land pattern 23 is set to a constant value. Thus, the occurrence of variation can be prevented about the magnitude of the hollow region formed by laser irradiation at the exposed part of the substrate 13 inevitably generated between the straight line part 32a and the land pattern 23.

Next, the position indicator 1 according to a second embodiment of the present invention will be described. The position indicator 1 according to the present embodiment is different from the position indicator 1 according to the first embodiment in that the interconnects 32 are replaced by interconnects 33a and 33b shown in FIG. 5, and has the same configuration as the position indicator 1 according to the first embodiment in the other points. In the following, a description will be made with focus on the difference from the position indicator 1 according to the first embodiment.

Figure 5:
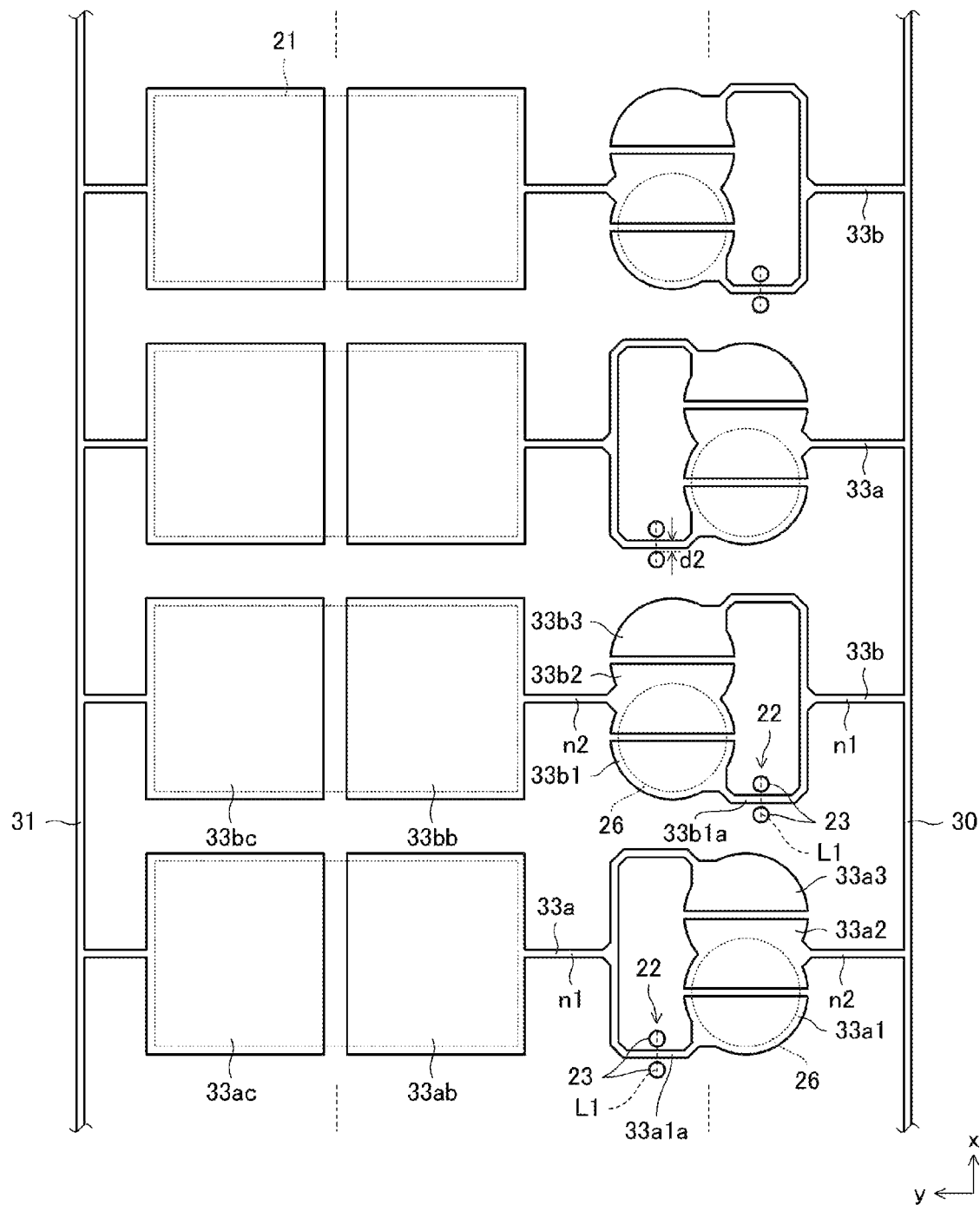
FIG. 5 is a schematic diagram of part of a circuit formed on a substrate configuring a position indicator according to a second embodiment of the present disclosure.

As shown in FIG. 5, the position indicator 1 according to the present embodiment has a configuration in which the plural interconnects 33a (first interconnects) and the plural interconnects 33b (second interconnects) each linking the interconnect 30 and the interconnect 31 are alternately disposed in the x-direction.

First, a description will be made with focus on the interconnect 33a. The interconnect 33a includes the following parts: a node n1 (first node); first and third parts 33a1 and 33a3 each connected to one side of the node n1; a pad 33ab connected to the other side of the node n1; a node n2 (second node) connected to the interconnect 30 on one side; a second part 33a2 connected to the other side of the node n2; and a pad 33ac connected to the interconnect 31.

The pads 33ab and 33ac are each an interconnect pattern that extends in the y-direction and has a substantially rectangular shape, and are formed opposed to each other in the y-direction with the intermediary of a groove having a constant width. The capacitor 21 as a chip component is placed on these pads. One end of the capacitor 21 is connected to the pad 33ab and the other end is connected to the pad 33ac.

The first part 33a1 has a straight line part 33a1a extending along the y-direction. In the present embodiment, the cutting point 22 is disposed at this straight line part 33a1a. On both sides of the cutting point 22, two land patterns 23 are disposed so that the straight line part 33a1a is interposed therebetween, similarly to the first embodiment. The specific arrangement of each land pattern 23 is decided so that the shortest distance d2 from the corresponding straight line part 33a1a is a constant value for the same reason as the first embodiment.

Because of the provision of the land patterns 23 at the cutting point 22, also in the present embodiment, the hollow regions generated in the substrate 13 due to the laser can be alleviated on the same principle as that described in the first embodiment.

The second part 33a2 is disposed to be interposed between the semicircular part of the first part 33a1 and the semicircular part of the third part 33a3. Each of the separation between the first part 33a1 and the second part 33a2 and the separation between the second part 33a2 and the third part 33a3 is made by a groove that extends along the y-direction and has a constant width as shown in FIG. 5. Due to the existence of the grooves, the second part 33a2 is insulated from each of the first part 33a1 and the third part 33a3 in terms of the interconnect pattern. On the other hand, the first part 33a1 and the third part 33a3 are connected to each other by the node n1.

As shown in FIG. 5, the first part 33a1 and the second part 33a2 are electrically connected to each other by a solder 26. It is preferable to attach this solder 26 before carrying out the step of interconnect cutting by a laser. In contrast, the solder 26 is not attached between the second part 33a2 and the third part 33a3. Because such a configuration is employed, the node n1 is completely insulated from the node n2 after the straight line part 33a1a is cut by a laser at the cutting point 22.

However, in some cases, after the node n1 is completely insulated from the node n2 in this manner, the need to electrically connect the node n1 and the node n2 again arises for the purpose of fine adjustment of the capacitance of the LC resonant circuit or the like. The structure of the interconnect 33a shown in FIG. 5 is to realize this. In the case of electrically connecting the node n1 and the node n2 again, the second part 33a2 and the third part 33a3 are connected to each other by the solder 26 by reflowing the solder 26. This makes it possible to electrically connect the node n1 and the node n2 again easily by manual work after interconnect cutting by a laser.

Next, a description will be made with focus on the interconnect 33b. The interconnect 33b includes the following parts: a node n1 (first node) connected to the interconnect 30 on one side; first and third parts 33b1 and 33b3 each connected to the other side of the node n1; a node n2 (second node); a second part 33b2 connected to one side of the node n2; a pad 33bb connected to the other side of the node n2; and a pad 33bc connected to the interconnect 31.

In the configuration of the interconnect 33b, the pads 33bb and 33bc have the same configuration as the pads 33ab and 33ac of the interconnect 33a. The capacitor 21 as a chip component is placed also on the pads 33bb and 33bc. One end of this capacitor 21 is connected to the pad 33bb and the other end is connected to the pad 33bc.

The configuration of the part between the node n1 and the node n2 is similar to that of the interconnect 33a. However, in the interconnect 33b, the positions of the node n1 and the node n2 are opposite to those of the interconnect 33a also as shown in FIG. 5. In association with this, the shape and arrangement of the configuration between the node n1 and the node n2 are also line-symmetric with respect to those of the interconnect 33a, with the axis of symmetry being a straight line (not shown) that passes through the midpoint of a line segment linking the node n1 and the node n2 and is in parallel to the x-direction.

The cutting point 22 in the interconnect 33b is provided at a straight line part 33b1a extending along the y-direction. The straight line part 33b1a is part of the first part 33b1. Also on both sides of this cutting point 22, two land patterns 23 are disposed similarly to the interconnect 33a. By providing these land patterns 23, the hollow regions generated in the substrate 13 due to the laser can be alleviated also regarding the cutting of the interconnect 33b.

The point that the first part 33b1 is connected to the second part 33b2 by the solder 26 whereas the solder 26 is not disposed between the second part 33b2 and the third part 33b3 and the purpose of employing such a configuration are also the same as those of the interconnect 33a. Specifically, if the need to electrically connect the node n1 and the node n2 again arises after the straight line part 33b1a is cut at the cutting point 22, the second part 33b2 and the third part 33b3 may be connected to each other by the solder 26 by reflowing the solder 26.

The purpose of alternately disposing the interconnects 33a and the interconnects 33b in the x-direction is to efficiently use the region on the substrate 13 similarly to the purpose of disposing the manual jumper positions 24 with alternate displacement in the y-direction in the position indicator 1 according to the first embodiment. Specifically, by alternately disposing the interconnects 33a and the interconnects 33b in the x-direction, the distance between the interconnects adjacent to each other in the x-direction (between the interconnect 33a and the interconnect 33b, in the present embodiment) can be made shorter than in the case of using only the interconnects 33a or the interconnects 33b. Therefore, alternately disposing the interconnects 33a and the interconnects 33b in the x-direction enables efficient use of the region on the substrate 13.

As described above, also according to the position indicator 1 in accordance with the present embodiment, the land patterns 23 play a role to protect the substrate 13 from the laser and thus the hollow regions generated in the substrate 13 when the interconnects 33a and 33b are cut by using a laser can be alleviated. Therefore, interconnect cutting by a laser is enabled.

Furthermore, according to the position indicator 1 in accordance with the present embodiment, in the interconnect 33a, the second part 33a2 is disposed to be interposed between the first part 33a1 and the third part 33a3 and the solder 26 is put between the first part 33a1 and the second part 33a2. In the interconnect 33b, the second part 33b2 is disposed to be interposed between the first part 33b1 and the third part 33b3 and the solder 26 is put between the first part 33b1 and the second part 33b2. Therefore, regarding both the interconnects 33a and 33b, even after the corresponding capacitor 21 is isolated from the circuit once by interconnect cutting by a laser, the capacitor 21 can be incorporated into the circuit again by only reflowing the solder 26.

Furthermore, according to the position indicator 1 in accordance with the present embodiment, the distance between the interconnects adjacent to each other in the x-direction (between the interconnect 33a and the interconnect 33b) can be made shorter, which allows efficient use of the region on the substrate 13.

Next, regarding the position indicators 1 having the configurations described in the first and second embodiments, a step of adjusting the resonant frequency of the LC resonant circuit by using interconnect cutting by a laser will be specifically described.

Figure 6:
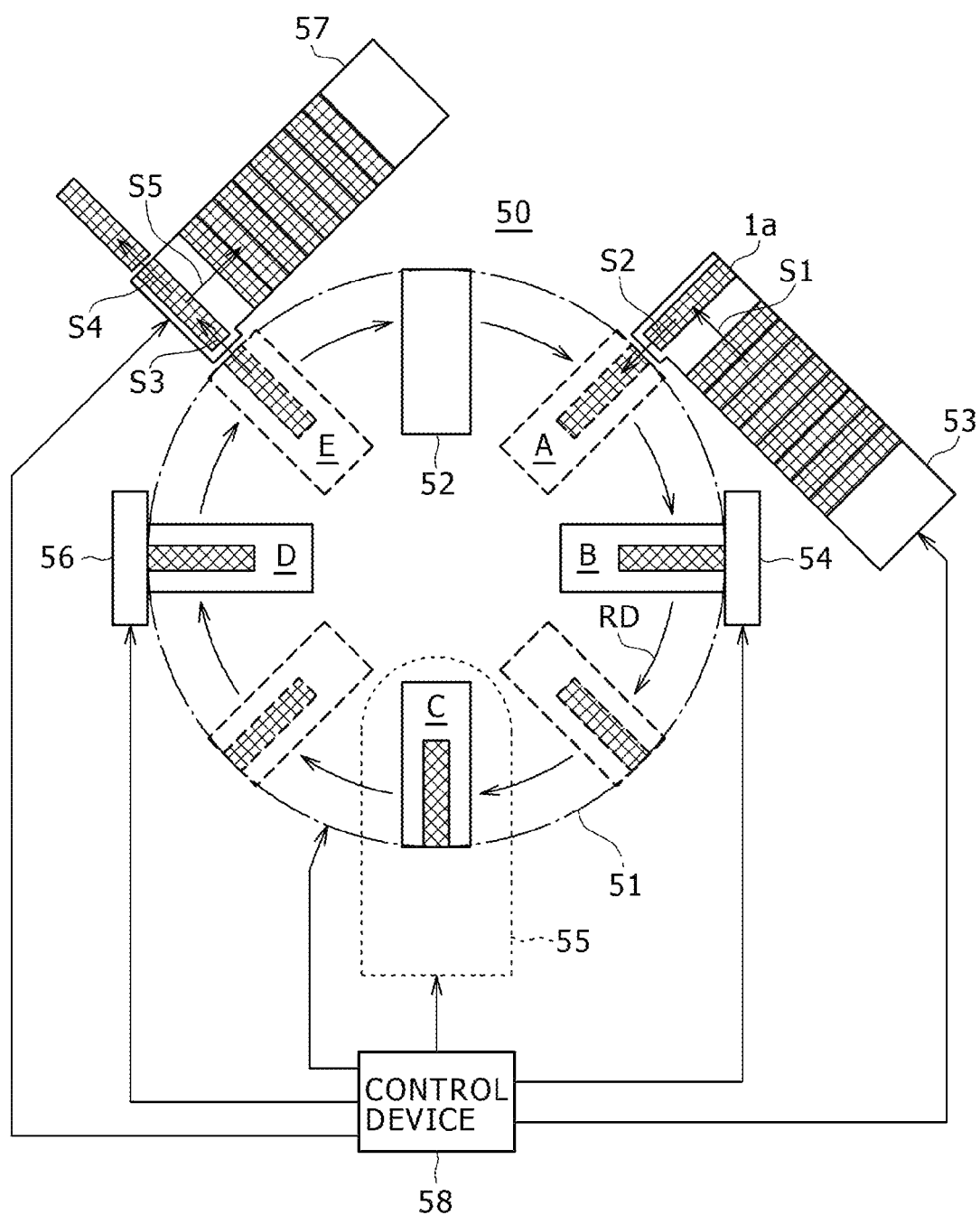
FIG. 6 is a schematic diagram of test equipment for adjusting the resonant frequency of an LC resonant circuit formed on the substrate shown in FIG. 1B.

This step is carried out by using test equipment 50 shown in FIG. 6. As shown in FIG. 6, this equipment includes a circular rotating base 51 configured to be rotatable around its center as the rotation center, four stages 52 that are each fixed to the rotating base 51 and are disposed at equal intervals along the circumference of the rotating base 51, a substrate supply device 53, frequency measuring devices 54 and 56, a resonant frequency adjusting device 55, a substrate ejecting device 57, and a control device 58. The respective devices forming the test equipment 50 are configured to operate in synchronization with each other under control of the control device 58. Furthermore, the four stages 52 are configured to move along a rotation direction RD shown in the diagram in association with the rotation of the rotating base 51.

First, intermediate products 1a of the position indicators 1 as the target of measurement and adjustment of the resonant frequency are loaded into the substrate supply device 53. The intermediate products 1a are products in a state in which at least all of the constituent elements of the LC resonant circuit (respective elements shown in FIG. 2) are formed. It is preferable for the intermediate products 1a to be in a state in which the solders 25 (FIG. 3) or the solders 26 (FIG. 5) are also applied on the substrate 13. Meanwhile, because of the need to perform interconnect cutting by a laser, it is preferable for the intermediate products 1a to be in a state in which the internal components including the substrate 13 have not yet been inserted into the case 2.

The substrate supply device 53 is configured to form a waiting line of the loaded intermediate products 1a. When the stage 52 reaches a position A shown in the diagram by the rotation of the rotating base 51, the substrate supply device 53 takes out the intermediate product 1a in the waiting line in a first-in first-out manner and sets it on the stage 52 as shown in arrows S1 and S2 in FIG. 6.

Thereafter, when the stage 52 reaches a position B resulting from rotation from the position A by 45° by the rotation of the rotating base 51, measurement of the resonant frequency by the frequency measuring device 54 is performed. It suffices for this measurement to be coarse measurement because precise measurement is performed in the resonant frequency adjusting device 55.

When the rotating base 51 further rotates and the stage 52 reaches a position C resulting from rotation from the position B by 90°, precise measurement of the resonant frequency and interconnect cutting at the cutting point 22 shown in FIG. 3 or FIG. 5 according to the measurement result are performed by the resonant frequency adjusting device 55. The precise measurement of the resonant frequency can be performed in a short time by being performed on the basis of the result of the coarse measurement by the frequency measuring device 54. The interconnect cutting at the cutting point 22 is performed by a laser. That is, the resonant frequency adjusting device 55 has a function as a laser irradiation apparatus. The reason why the laser can be used for the interconnect cutting is because the land patterns 23 are formed at the cutting point 22 as described above. Because the cutting is performed by the laser, the work cost taken for the interconnect cutting is reduced in the test equipment 50 compared with the interconnect cutting step of the related art, in which the interconnect cutting is performed by manual work.

After the interconnect cutting by the resonant frequency adjusting device 55 ends, when the rotating base 51 further rotates and the stage 52 reaches a position D resulting from rotation from the position C by 90°, a test on the resonant frequency by the frequency measuring device 56 is performed. This test is performed by checking the frequency of a signal actually transmitted by the position indicator 1. In a specific example, the frequency measuring device 56 controls the on/off-state of the switch part 14 disposed on the substrate 13 and generates a magnetic field to store power in the LC resonant circuit of the intermediate product 1a. Then, the frequency measuring device 56 receives a signal including side switch information transmitted from the intermediate product 1a as the result of the power storing and checks the frequency of the signal. If the frequency measuring device 56 is configured in this manner and the position indicator 1 is configured to transmit the side switch information by frequency shift keying (FSK), it is more preferable to check whether or not the frequency matches a predetermined value of standard about each of the frequency corresponding to the on-state of the switch part 14 and the frequency corresponding to the off-state of the switch part 14.

After the test by the frequency measuring device 56 ends, when the rotating base 51 further rotates and the stage 52 reaches a position E resulting from rotation from the position D by 45°, the intermediate product 1a moves from the stage 52 to the substrate ejecting device 57 as shown by an arrow S3 in FIG. 6. At this time, the intermediate product 1a rejected in the test by the frequency measuring device 56 is ejected from the substrate ejecting device 57 as shown by an arrow S4 in FIG. 6. Although the subsequent treatment is based on manual work, it is also possible to further adjust the resonant frequency by using reflow of the solder 26 and return the intermediate product 1a to conforming products depending on the result of the adjustment if the intermediate product 1a is an intermediate product of the position indicator 1 according to the second embodiment.

On the other hand, the intermediate products 1a accepted in the test by the frequency measuring device 56 are accumulated in the substrate ejecting device 57 as shown by an arrow S5 in FIG. 6. The intermediate products 1a thus accumulated are taken out by an operator person to be sent to a step of assembling the position indicator 1.

As described above, according to the test equipment 50, measurement of the resonant frequency and adjustment of the resonant frequency based on the result of the measurement can be carried out regarding the position indicators 1 described in the first and second embodiments.

Although preferred embodiments of the present invention are described above, it is obvious that the present invention is not limited to such embodiments at all and the present invention can be carried out in various aspects without departing from the gist of the invention.

For example, in the position indicator 1 according to the second embodiment, the cutting point 22 is provided at the straight line part 33a1a extending along the y-direction in the first part 33a1 as shown in FIG. 5. However, because the first part 33a1 also has a straight line part extending along the x-direction as is apparent from FIG. 5, the cutting point 22 may be provided at this straight line part. Similarly, the cutting point 22 may be provided at a straight line part extending along the x-direction in the first part 33b1.

Furthermore, to efficiently use the region on the substrate 13, the manual jumper positions 24 are disposed with alternate displacement in the y-direction in the first embodiment and the interconnects 33a and the interconnects 33b are alternately disposed in the x-direction in the second embodiment. However, such structures do not have to be employed if the region on the substrate 13 has sufficient room.

Furthermore, although the cutting points 22 are provided at straight line parts of the interconnects 32 and the interconnects 33a and 33b in the respective embodiments, the cutting point 22 may be provided at a part having another shape such as a curve. However, providing the cutting point 22 at a straight line part of the interconnect as in the respective embodiments is advantageous to surely perform interconnect cutting by a laser.

What is claimed is:

1. A position indicator comprising:
a chassis;
a substrate disposed inside of the chassis;
a coil;
a plurality of capacitors disposed on the substrate;
a plurality of interconnects disposed on the substrate such that each of the plurality of interconnects at least partially connects a respective one of the plurality of capacitors to the coil in parallel; and
a plurality of pairs of land patterns disposed on the substrate,
wherein:
each of the plurality of pairs of land patterns includes a first land pattern and a second land pattern,
each of the plurality of pairs of land patterns corresponds to a respective one of the interconnects,
the plurality of pairs of land patterns is disposed such that each of the plurality of interconnects is at least partially interposed between the first land pattern and the second land pattern of the corresponding one of the pairs of land patterns, and
the first land pattern and the second land pattern of each of the plurality of pairs of land patterns have substantially a same thickness as the corresponding one of the interconnects or have a larger thickness than the corresponding one of the interconnects, and
the first land pattern and the second land pattern of each of the plurality of pairs of land patterns are electrically isolated from the corresponding one of the interconnects.

2. The position indicator according to claim 1, wherein each of the plurality of interconnects includes a straight line part extending along the substrate, and
the plurality of pairs of land patterns is disposed such that the straight line part of each of the plurality of interconnects is interposed between the first land pattern and the second land pattern of the corresponding one of the pairs of land patterns.

3. The position indicator according to claim 2, wherein the straight line part of each of the plurality of interconnects is disposed on a straight line extending along the substrate.

4. The position indicator according to claim 1, wherein each of the plurality of interconnects includes a first pad and a second pad that is adjacent the first pad, the first pad and the second pad being configured to be electrically isolated by removal of a solder that electrically couples the first pad and the second pad.

5. The position indicator according to claim 1, wherein each of the plurality of interconnects has
a first node and a second node,
a first part and a third part each connected to the first node, and
a second part connected to the second node,
the plurality of pairs of land patterns is disposed such that the first part of each of the plurality of interconnects is at least partially interposed between the first land pattern and the second land pattern of the corresponding one of the pairs of land patterns, and
the second part is interposed between the first and third parts.

6. The position indicator according to claim 5, wherein the first part of each of the plurality of interconnects has a straight line part, and
the plurality of pairs of land patterns is disposed such that the straight line part of each of the plurality of interconnects is interposed between the first land pattern and the second land pattern of the corresponding one of the pairs of land patterns.

7. The position indicator according to claim 5, wherein the plurality of interconnects includes a first group of the interconnects and a second group of the interconnects,
the first node of each of the interconnects included in the first group is connected to the corresponding one of the capacitors,
the second node of each of the interconnects included in the first group is connected to the coil,
the second node of each of the interconnects included in the second group is connected to the corresponding one of the capacitors,
the first node of each of interconnects included in the second group is connected to the coil, and
respective ones of the interconnects included in the first group and respective ones of the interconnects included in the second group are disposed alternately along the substrate.

8. The position indicator according to claim 1, wherein the plurality of interconnects and the plurality of pairs of land patterns are simultaneously formed by etching an electrically-conductive film formed on the substrate.

9. The position indicator according to claim 1, wherein the plurality of interconnects and the plurality of pairs of land patterns are formed from the same material.

10. The position indicator according to claim 1, wherein a shortest distance between each of the first land pattern and the second land pattern of each of the plurality of pairs land patterns and the corresponding one of the interconnects is a constant value.

11. The position indicator according to claim 1, wherein the chassis is pen-shaped, the substrate is rectangular and has a longer side longer than an inner diameter of the chassis and a shorter side shorter than the inner diameter, and the substrate is disposed inside of the chassis such that the longer side is in parallel to a longitudinal direction of the chassis.

12. The position indicator according to claim 11, wherein the plurality of capacitors is disposed on the substrate along the longer side of the substrate.

13. A manufacturing method of a position indicator that includes a chassis and a substrate disposed inside of the chassis, the method comprising:

forming a plurality of interconnects on a surface of the substrate, each of the plurality of interconnects having a first end connected to a first end of a coil and a second end connected to a second end of the coil;

forming a plurality of pairs of land patterns on the surface of the substrate, each of the pairs of land patterns including a first land pattern and a second land pattern and corresponding to one of interconnects, the plurality of pairs of land patterns being disposed such that each of the plurality of interconnects is at least partially interposed between a corresponding one of the pairs of land patterns; and placing a plurality of capacitors on the plurality of interconnects such that each of the capacitors is placed on a corresponding one of the interconnects to at least partially connect the capacitor to the coil in parallel.

14. The manufacturing method according to claim 13, wherein:

the forming of the plurality of interconnects and the plurality of pairs of land patterns includes:
depositing an electrically-conductive film on the surface of the substrate, and
etching the electrically-conductive film.

15. The manufacturing method according to claim 14, further comprising:

cutting one of the interconnects by moving an irradiation point of a laser from the first land pattern to the second land pattern of the corresponding one of the pairs of land patterns.

16. The manufacturing method according to claim 14, wherein the forming of the plurality of interconnects forms the plurality of interconnects such that each of the plurality of interconnects has a first pad and a second pad that is adjacent the first pad, the method further comprising:

connecting a first end and a second end of each of the capacitors to the first pad and the second pad, respectively, of one of the plurality of interconnects.

17. The manufacturing method according to claim 14, wherein the forming of the plurality of interconnects forms the plurality of interconnects such that each of the plurality of interconnects has a first node and a second node, a first part and a third part each connected to the first node, and a second part connected to the second node and the second part is interposed between the first and third parts, the forming of the plurality of pairs of land patterns forms the plurality of pairs of land patterns such that the first part of each of the interconnects is interposed between the first land pattern and the second land pattern of the corresponding one of the pairs of land patterns, and the method further includes:

connecting the first part to the second part of each of the plurality of interconnects by a solder, cutting the first part of one of the interconnects by a laser by moving an irradiation point of the laser from the first land pattern to the second land pattern of the corresponding one of the pairs of land patterns, and connecting the second part to the third part of the one of the plurality of interconnects by the solder by reflowing the solder.

18. The manufacturing method according to claim 17, wherein the forming of the plurality of interconnects forms the plurality of interconnects such that the plurality of interconnects includes:

a first group of the interconnects, wherein the first node of each of the interconnects included in the first group of interconnects is connected to a corresponding one of the capacitors and the second node of each of the interconnects included in the first group of interconnects is connected to the coil, and a second group of the interconnects, wherein the second node of each of the interconnects included in the second group of interconnects is connected to a corresponding one of the capacitors and the first node of each of the interconnects included in the second group of interconnects is connected to the coil.

19. The manufacturing method according to claim 13, wherein the chassis is pen-shaped; and the substrate is rectangular and has a longer side longer than an inner diameter of the chassis and a shorter side shorter than the inner diameter, the method further comprising:

inserting the substrate inside of the chassis such that the longer side is in parallel to a longitudinal direction of the chassis.

* * * * *